United States Patent [19]

Meier

[11] Patent Number: 5,671,399

[45] Date of Patent: Sep. 23, 1997

[54] METHOD FOR HIERARCHIC LOGIC VERIFICATION OF VLSI CIRCUITS

[75] Inventor: Wolfgang Meier, Munich, Germany

[73] Assignee: Siemens Aktiengesellschaft, Munich, Germany

[21] Appl. No.: 498,687

[22] Filed: Jul. 3, 1995

[30] Foreign Application Priority Data

Jul. 4, 1994 [DE] Germany ............... 44 23 367.1

[51] Int. Cl.$^6$ ............... G06F 17/50; H01L 21/98
[52] U.S. Cl. ............... 395/500; 364/489; 364/490; 364/491
[58] Field of Search ............... 395/500; 364/488, 364/489, 490, 491

[56] References Cited

U.S. PATENT DOCUMENTS 5,519,628  5/1996  Russell et al. ............... 364/489

OTHER PUBLICATIONS

Meier et al., "PALACE: A Parallel & Hierarchial Layout Analyzer & Circuit Extractor", Euro Des & Test Conf, IEEE 1996, pp. 357–361.
Meier, "Hierarchial Layout Verification for Submicron Designs"; Euro Des & Test Conf, IEEE 1990, pp. 382–386.
Garbers et al., "Finding Clusters in VLSI Circuits", 1990 Int'l Comp. Aided Des Conf, IEEE, pp. 520–523.

Chowdhury et al., "Hierarchical Layout Synthesis of Analogue VLSI Circuits Using an Intelligent Parsing Mech", 1991 IEEE Midwest Symp. Circ & Sys, pp. 835–838.
IEEE 1993 Custom Integrated Circuits Conference, HCNC: High Capacity Netlist Compare, Rahul Razdan, pp. 17.6.1–17.6.5.
27th ACM/IEEE Design Automation Conference, 1990, "Comparing Structurally Different Views of a VLSI Design", Mike Spreitzer, Paper 11.1, pp. 200–206.

*Primary Examiner*—Kevin J. Teska
*Assistant Examiner*—Tyrone V. Walker
*Attorney, Agent, or Firm*—Hill, Steadman & Simpson

[57] ABSTRACT

In a method for hierarchic logic verification of VLSI circuits a hierarchic layout circuit (1234') is acquired from the physical layout of the respective VLSI circuit using an extraction program is compared to a hierarchic logic plan circuit (1234) defined by an appertaining logic plan. They are being compared such that both the layout circuit as well as the logic plan circuit are transformed independently of one another into equivalent circuits (1234") having a respectively minimum plurality of terminals for all sub-circuits and non-isomorphic hierarchies are brought into coincidence during the circuit comparison by temporary, partial expanding. The advantage thereby achieved is that no explicit user rules with respect to the method execution are required, and that substantially less memory space and a significantly shorter processing time are required for the implementation of the method than given non-hierarchic methods.

3 Claims, 2 Drawing Sheets

METHOD FOR HIERARCHIC LOGIC VERIFICATION OF VLSI CIRCUITS

BACKGROUND OF THE INVENTION

When designing integrated circuits, a logic plan is first designed and the physical layout is subsequently designed or the geometrical description of the masks is produced, whereby the latter usually occurs only partially by machine dependence on the logic plan. An important step in the design process is the verification of the correct conversion of the logic plan into a corresponding layout. To that end, a layout circuit is produced from the layout description with a prior art extraction method. By comparing the extracted layout circuit to the logic plan circuit, it can be determined whether a specific specification was in fact converted into an equivalent layout.

However, current designs in sub-micrometer technologies, for example 64 M or 256 M DRAM circuits contain millions of components and can no longer be practically verified with most known methods, since the main memory required for the circuit comparison is not adequate, and since extremely high program execution times are required.

LSI circuits are generally hierarchically constructed, that is, repeatedly required sub-circuits are only described once and only references to these sub-circuits are located at the required places in the circuit. A sub-circuit is thus composed of elementary components, as well as, references to other sub-circuits that can themselves in turn contain sub-circuits. Connections between components of different sub-circuits are described by terminals of the sub-circuits.

In many known methods for a network list comparison of circuits, the hierarchic structure of the circuits to be compared is usually not utilized and the circuits are completely expanded before the comparison, that is, in detail down to the component level, whereby all references to lower-ranking sub-circuits are replaced by the components contained therein.

Only a few methods utilize the hierarchic structure of these circuits. In one such method it is basically only one pair of sub-circuits that are compared. Occurrences within these sub-circuits are thereby treated like complex components, macro-components, whose internal circuits were verified in a preceding step and which can therefore be ignored. These known methods, however, assume highly limiting conditions about the structure of the hierarchic circuits. It is usually assumed that both circuits have isomorphic hierarchies, that is there must be exactly one identically constructed sub-circuit in the other circuit for every sub-circuit in the one circuit. Equivalent sub-circuits, moreover, must have identical interfaces, that is, an identical plurality of terminals. These prerequisites, however, are only seldom met in practical applications.

The publication by Rahul Razdan, "HCNC: High Capacity Netlist Compare", Conference Vol. of the IEEE 1993 Custom Integrated Circuits Conference, pp. 17.6.1–17.6.5 discloses a method wherein the circuits to be compared are first completely expanded and the components are combined to form function blocks, whereby new circuits are formed with a single-stage hierarchy. These then serve as input quantities for the actual comparison of the circuit netlists.

In this way, data sets and execution times are respectively reduced on average by a factor 6 as compared to a non-hierarchic method. This, however, is far from being adequate for circuits having several million components.

Further, the publication by Mike Spreitzer, "Comparing the Structurally Different Views of a VLSI Design", Conference Vol. of the 27th ACM/IEEE Design Automation Conference, paper 11.1, pp. 200–206, discloses a method wherein the circuits are restructured into equivalent circuits having isomorphic hierarchy by transformations to be prescribed by the user, and are subsequently compared. What is thereby disadvantageous, however, is that the method generally assumes exact knowledge about the structure of the circuits on the part of the user and cannot be implemented without manual interventions.

SUMMARY OF THE INVENTION

It is an object of the present invention to provide a method wherein circuits having non-isomorphic hierarchy and incompatible interfaces of the sub-circuits can be compared in purely machine fashion with optimally little outlay for memory space and optimally short processing time.

In general terms the present invention is a method for hierarchic logic verification of VLSI circuits, wherein a hierarchic layout circuit acquired from the physical layout of the respective VLSI circuit using an extraction method is compared to a hierarchic logic plan circuit defined by a logic plan. In a first step, both the layout circuit, as well as, the hierarchic logic plan circuit are transformed such that the number of terminals of the sub-circuits of each hierarchy level is a minimum. This occurs in that terminals of a sub-circuit are canceled that are not connected to any component of this sub-circuit within this sub-circuit or are not connected to any occurrences of a lower-ranking sub-circuit that belongs to at least one next-lower hierarchy level. Terminals of a sub-circuit that are externally connected to one another in all occurrences of a respective sub-circuit are combined to form a common terminal, whereby this ensues across all hierarchy levels. Terminals of a sub-circuit that do not have an external connection to at least one component of another sub-circuit in any occurrence of this sub-circuit are canceled as external terminal on the respective hierarchy level. In a second step, pairs of potentially equivalent sub-circuits are formed in that corresponding sub-circuits with the same name are sought in the extracted circuit and in the logic plan circuit and are only allocated to one another when these also have an identical number of terminals. In a third step, the internal hierarchies of a pair of potentially equivalent sub-circuits are reshaped into identically fashioned (isomorphic) hierarchies. Occurrences of sub-circuits to which a partner in the respectively other circuit is allocated are replaced by a macro component that cannot be further detailed, insofar as at least all terminals of both occurrences of the sub-circuits can be completely allocated to one another. Occurrences of sub-circuits to which no partner in the respectively other circuit is allocated are partially expanded by switching to a lower hierarchy level until at least one occurrence of a sub-circuit is again present for which a partner in the respectively other circuit exists with allocated terminals. This respective occurrence of the respective lower-ranking sub-circuit is also replaced by a respective macro component. Occurrences of sub-circuits to which a partner in the respectively other circuit is allocated and wherein all terminals of both occurrences cannot be allocated to one another are optionally also partially expanded farther, as in the last above partial expansion, or the comparison of the higher-ranking circuit parts is suppressed. Occurrences of sub-circuits that do not occur an identical number of times in both circuits after implementation of the aforementioned steps are expanded farther, as in the above partial expansion, until the number of occurrences of all sub-circuits respectively corresponding to one another coincides. The third step is to be previously applied to the lower-ranking sub-circuits occurring in the respective sub-circuits to be compared.

The advantages achieved by the present invention are that no explicit user rules with respect to the method execution are required and that significantly less memory space and a substantially shorter processing time are required for the implementation of the method than for non-hierarchic methods. The reduction factor has typical values that are greater than 100.

Circuits having up to 4 million transistors have been verified in a few minutes with the method of the present invention.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
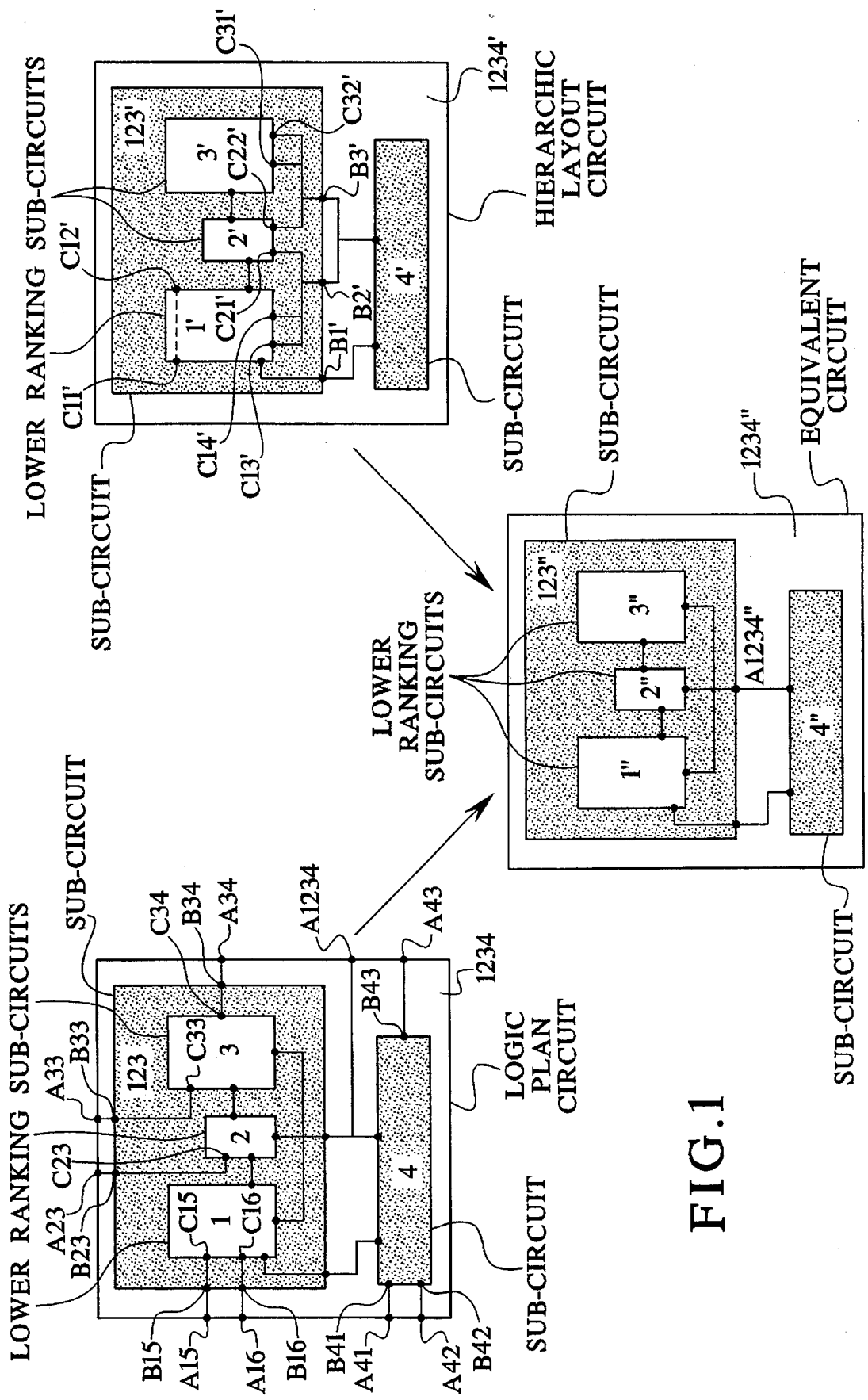
FIG. 1 is an illustration for explaining a part of the inventive method wherein a norming of the interfaces of all sub-circuits ensues.

For explaining a first constituent of the method, FIG. 1, by way of example, respectively shows a block circuit diagram of a logic plan circuit 1234 defined by a logic plan. FIG. 1 also shows a block circuit diagram of a hierarchic layout circuit 1234' acquired from the physical layout of the respective VLSI circuit using a known extraction method. These two circuits are transformed independently of one another into equivalent circuits, whereby only one of these equivalent circuits (equivalent circuit 1234") is shown in FIG. 1.

The logic plan circuit 1234 contains a sub-circuit 4 and a sub-circuit 123 which in turn has lower-ranking sub-circuits 1, 2 and 3. The circuit 1234 has external terminals A41, A42 and A43 that are connected to corresponding terminals B41, B42 and B43 of the sub-circuit 4, has external terminals A15, A16, A23, A33 and A34 that are connected to corresponding terminals B15, B16, B23, B33 and B34 of the sub-circuit 123, and also has an external terminal A1234 that is connected to an internal connection between the two sub-circuits 123 and 4. Within the sub-circuit 123, the terminals B15, B16 are connected to the lower-ranking sub-circuit 1, the terminal B23 is connected to the lower-ranking sub-circuit 2 and the terminals B33 and B34 are connected to the lower-ranking sub-circuit 3. Further, another terminal of the lower-ranking sub-circuit 1 is connected via a terminal of the sub-circuit 123 to a terminal of the sub-circuit 4 and there is a connection in the sub-circuit 123 between the lower-ranking sub-circuits 1, 2 and 3, whereby this connection is connected to the external terminal A1234 via a terminal of the sub-circuit 123. Over and above this, however, there is also a connection between the lower-ranking sub-circuits 1 and 2 as well as the lower-ranking sub-circuits 2 and 3.

Correspondingly, the layout circuit 1234' thereby contains a sub-circuit 4' and a sub-circuit 123' that in turn comprises lower-ranking sub-circuits 1', 2' and 3'. The circuit 1234' has no external terminals. The sub-circuit 123' has three terminals B1', B2' and B3', whereby B2' and B3' are connected to one another within the circuit 1234' and are additionally connected to a terminal of the sub-circuit 4'. Further, the terminal B1' of the sub-circuit 123' is connected to a further terminal of the sub-circuit 4'. Within the sub-circuit 123' the terminals C13' and C14' of the lower-ranking sub-circuit 1' as well as the terminal C21' of the lower-ranking sub-circuit 2' are connected to the terminal B2', and the terminals C31' and C32' of the lower-ranking sub-circuit 3' as well as the terminal C22' of the lower-ranking sub-circuit 2' are connected to the terminal B3'. Further, another terminal of the lower-ranking sub-circuit 1' is connected to the terminal B1' and there is a respective connection within the sub-circuit 123' between the lower-ranking sub-circuits 1' and 2' or, respectively, 2' and 3'. The terminals C11' and C12' of the sub-circuit 1' are connected to one another inside 1' but are not connected to any component and any lower-ranking occurrence within the sub-circuit 1'.

In a first step of the inventive method, both the layout circuit 1234', as well as, the logic plan circuit 1234 are transformed independently of one another such that the number of terminals of the sub-circuits of every hierarchy level is minimal. This occurs here in that, first, all terminals, for example, the terminals C11' and C12' of sub-circuit 1', that are not connected to any internal component or to any occurrence within this sub-circuit, are canceled for each sub-circuit. Before a respective sub-circuit, all the sub-circuits ranking lower than the respective sub-circuit are first processed. Second, the terminals that are externally connected for all applications of the respective sub-circuit are replaced by a common terminal for all sub-circuits. As, for example, in the case of the terminals C21' and C22' of sub-circuit 2', all occurrences are thereby run through proceeding from the highest hierarchy level in order to also recognize indirect connections across a plurality of hierarchy levels. Third, when this has ensued, third, the terminals for all sub-circuits are canceled that have an external connection to at least one component or to another sub-circuit outside the sub-circuit under consideration in no occurrence of this sub-circuit.

Given the exemplary circuits described in FIG. 1, the first step of the inventive method successively effects the following modifications: the terminals C11' and C12' of the sub-circuit 1' that are not connected to any component or to any occurrence within this sub-circuit are first canceled in the logic plan circuit. The combining of externally connected terminals begins in the hierarchically highest circuit 1234'. Here, the terminals B2' and B3' of the sub-circuit 123' are recognized as being connected and are combined to form a common terminal. Within the sub-circuit 123', the terminals C13' and C14' of the sub-circuit 1' as well as the terminals C31' and C32' of the sub-circuit 3' are combined since these are connected within the sub-circuit 123'. Since the terminals B2' and B3' were previously combined, however, the terminals C21' and C22' of the sub-circuit 2' are now also connected and are likewise combined. All external terminals of the circuit 1234 are first canceled in the layout circuit, since these are not connected further to the outside. As a result thereof, the terminals B15, B16, B23, B33 and B34 of the sub-circuit 123 as well as the terminals B41, B42 and B43 of the sub-circuit 4 are then without external connection and are eliminated. As a result thereof, the terminals C15 and C16 of the sub-circuit 1, the terminal C23 of the sub-circuit 2 as well as the terminals C33 and C34 of the sub-circuit 3 in turn remain without external connection and are canceled.

As a result of the first method step of the invention, the two circuits 1234 and 1234' are respectively converted into the equivalent circuit 1234", which is shown only once in FIG. 1. This circuit has a sub-circuit 4" and a sub-circuit 123" with lower-ranking sub-circuits 1", 2" and 3", whereby the circuit 1234" corresponds to the circuit 1234 without the external terminals A15, A16, A23, A33, A34, A41, A42, A43 and A1234.

In a second inventive method step, pairs of potentially equivalent sub-circuits are then formed, whereby corresponding sub-circuits in the layout circuit and in the logic plan circuit having the same name are sought and are only allocated to one another when these also have an identical plurality of terminals.

In a third and last step, the internal hierarchies of the sub-circuits for a pair of potentially equivalent sub-circuits are now respectively converted into isomorphic (identically designed) hierarchies in that, first, occurrences of the sub-circuits to which a partner in the respectively other circuit is allocated are replaced by a macro component that cannot be further-detailed, insofar as at least all terminals of both occurrences can be completely allocated to one another. Second, occurrences of all sub-circuits to which no partner in the respectively other circuit is allocated are partially expanded by switching to a lower hierarchy level until an occurrence of a sub-circuit is again respectively encountered for which there is a partner in the other circuit with allocated terminals and this occurrence of the lower-ranking sub-circuit can likewise be replaced by a macro component. Third, following occurrences of sub-circuits to which a partner in the respectively other circuit is allocated and wherein all terminals of both occurrences cannot be allocated to one another are, as recited above, partially expanded. Optionally, the expanding of such occurrences can be suppressed. Sub-circuits that contain such occurrences, however, are then not compared. Finally, occurrences of sub-circuits that do not occur an identical number of times in both circuits after the implementation of the aforementioned steps are further partially expanded, as recited above, until the plurality of occurrences of all sub-circuits allocated to one another coincides. The entire third step is to be always applied previously onto the lower-ranking sub-circuits that occur in the respective sub-circuits to be compared.

As a result, two circuits arise that can be completely compared by machine without auxiliary information, these having components and macro components that represent the hierarchy occurrences of sub-circuits. Each type of a macro component occurs an identical number of times in the circuits that can be compared entirely by machine and respectively have an identical plurality of terminals.

Figure 2:
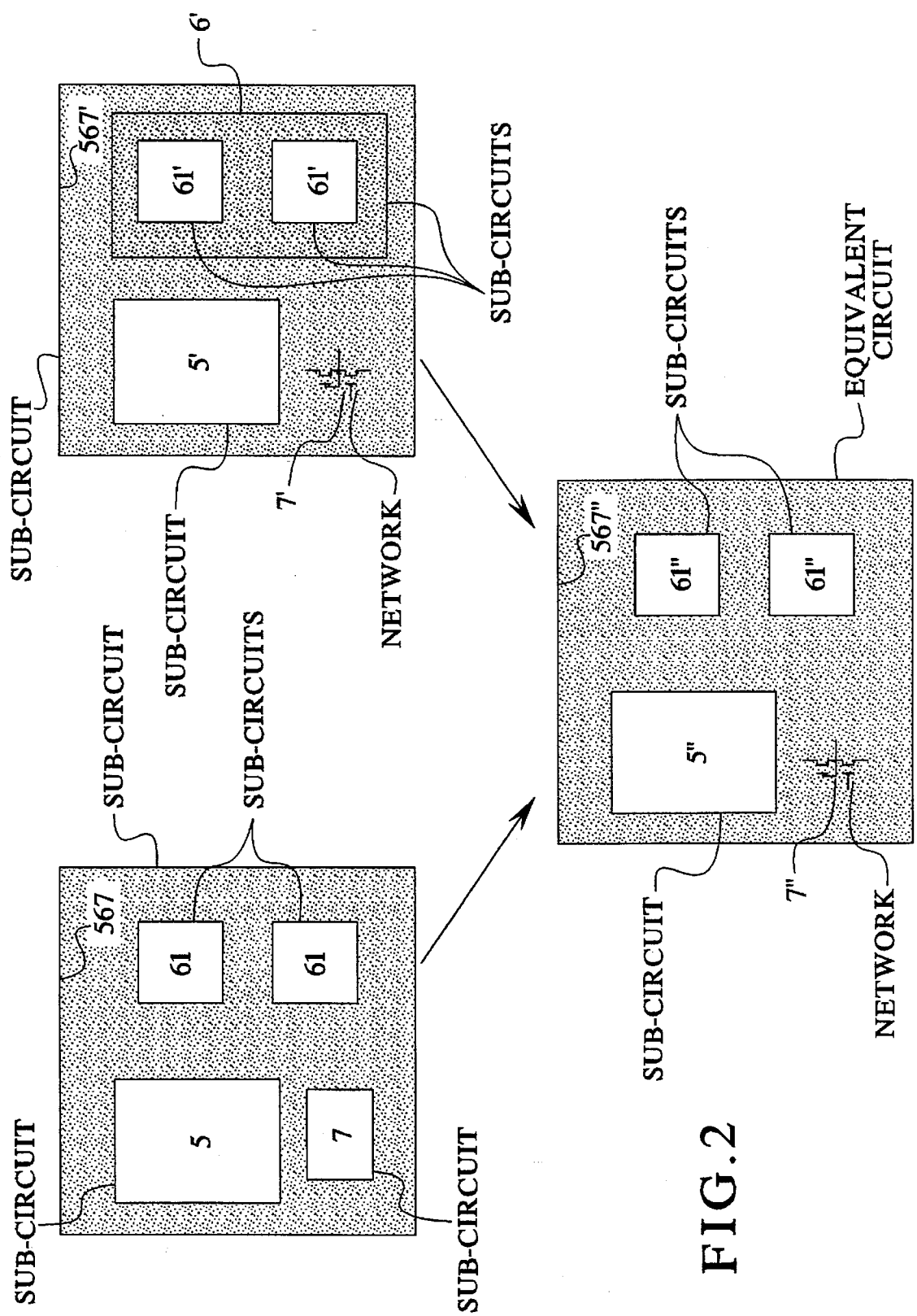
FIG. 2 is an illustration for explaining a further part of the inventive method, whereby non-isomorphic hierarchies are brought into coincidence by partial expansion.

By way of example, FIG. 2 shows a block circuit diagram of a sub-circuit 567 of the logic plan circuit and of a corresponding sub-circuit 567' of the layout circuit for explaining the third constituent of the method. The circuit part 567 has an occurrence of the sub-circuit 5, two occurrences of the sub-circuit 61 and one occurrence of the sub-circuit 7. The circuit part 567', by contrast, has one occurrence of the sub-circuit 5', one occurrence of the sub-circuit 6' and a network 7' expanded to components level, whereby the sub-circuit 6' in turn contains two occurrences of the sub-circuit 61'. Let the sub-circuits 5 and 5' as well as 61 and 61' be sub-circuits respectively corresponding to one another with allocatable terminals. The sub-circuit 7 internally contains a circuit that corresponds to the expanded network 7'.

The occurrences of 5 and 61 in the logic plan circuit are replaced by macro components 5" and 61" since the sub-circuits respectively have a partner with allocatable terminals allocated to them in the layout circuit. The occurrences of the sub-circuit 7 is expanded since this sub-circuit has no partner allocated to it. The occurrence of the sub-circuit 5' in the layout circuit is likewise replaced by a macro component 5". The occurrence of the sub-circuit 6' is partially expanded since there is no sub-circuit in the logic plan netlist corresponding to sub-circuit 6'. When expanding the sub-circuit 6', two occurrences of the sub-circuit 61' result for which there is an allocated sub-circuit 61. The two occurrences are thus not expanded farther but replaced by macro components 61". The sub-network 7' is preserved unaltered. Both circuits now contain a respective occurrence or, respectively, macro component 5", two occurrences or, respectively, macro components 61" and sub-networks 7, 7' or, respectively, 7". Since all remaining sub-circuits 5" and 61" occur an identical number of times in both circuits, no further expansions are required. As a result thereof, both circuits have now been given a hierarchy that corresponds to the hierarchy represented by the circuit 567".

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for hierarchic logic verification of VLSI circuits, a hierarchic layout circuit acquired from a physical layout of a VLSI circuit using an extraction procedure being compared to a hierarchic logic plan circuit defined by a logic plan, comprising the steps of:

in a first step, transforming the layout circuit as well as the hierarchic logic plan circuit such that a number of terminals of sub-circuits of each hierarchy level is minimal, whereby in a step 1a, canceling terminals of a sub-circuit that are not connected to any component of this sub-circuit within this sub-circuit or are not connected to any occurrence of a lower-ranking sub-circuit that belongs to at least one next-lower hierarchy level, in a step 1b, combining terminals of a sub-circuit that are externally connected to one another in all occurrences of a respective sub-circuit to form a common terminal, whereby this ensues across all hierarchy levels, and in a step 1c, canceling terminals of a sub-circuit that do not have an external connection to at least one component of another sub-circuit in any occurrence of this sub-circuit as external terminal on the respective hierarchy level; and in a second step, forming pairs of potentially equivalent sub-circuits in that corresponding sub-circuits with a common name are sought in the layout circuit and in the logic plan circuit and are only allocated to one another for sub-circuits having an identical number of terminals; and in a third step, reshaping internal hierarchies of a pair of potentially equivalent sub-circuits into isomorphic hierarchies, whereby in a step 3a, replacing occurrences of sub-circuits, to which a partner in the respectively other circuit is allocated, by a macro component that cannot be further detailed, insofar as at least all terminals of both occurrences of sub-circuits are completely allocated to one another, in a step 3b, partially expanding occurrences of sub-circuits, to which no partner in the respectively other circuit is allocated, by switching to a lower hierarchy level until at least one occurrence of a sub-circuit is again present for which a partner in the respectively other circuit exists with allocated terminals, and replacing the respective occurrence of the respective lower-ranking sub-circuit by a respective macro component, in a step 3c, further partially expanding as in step 3b occurrences of sub-circuits to which a partner in the respectively other circuit is allocated and wherein all terminals of both occurrences cannot be allocated to one another, or suppressing comparison of the higher-ranking circuit parts, and in a step 3d, further expanding as in step 3b occurrences of sub-circuits that do not occur an identical number of times in both circuits after implementation of the aforementioned steps until a plurality of occurrences of all sub-circuits respectively corresponding to one another coincides, step 3 having been already previously applied to lower-ranking sub-circuits occurring in the respective sub-circuits to be compared.

2. A method for hierarchic logic verification of VLSI circuits, a hierarchic layout circuit acquired from a physical layout of a VLSI circuit using an extraction procedure being compared to a hierarchic logic plan circuit defined by a logic plan, the layout circuit and the logic plan circuit having sub-circuits, comprising the steps of:

canceling terminals of a respective sub-circuit of the sub-circuits that are not connected to any component of the respective sub-circuit within this sub-circuit, or are not connected to any occurrence of a lower-ranking sub-circuit that belongs to at least one next-lower hierarchy level;

combining terminals of a respective sub-circuit of the subcircuits that are externally connected to one another in all occurrences of the respective sub-circuit to form a common terminal, whereby this ensues across all hierarchy levels; and canceling terminals of a respective sub-circuit of the sub-circuits that do not have an external connection to at least one component of another sub-circuit of the sub-circuits in any occurrence of this sub-circuit as external terminal on the respective hierarchy level, wherein the layout circuit as well as the hierarchic logic plan circuit are transformed such that a number of terminals of sub-circuits of each hierarchy level is minimal;

forming pairs of potentially equivalent sub-circuits in that corresponding sub-circuits with a common name are sought in the layout circuit and in the logic plan circuit and are only allocated to one another for sub-circuits having an identical number of terminals;

replacing occurrences of sub-circuits, to which a partner in the respectively other circuit is allocated, by a macro component that cannot be further detailed, insofar as at least all terminals of both occurrences of sub-circuits are completely allocated to one another;

partially expanding occurrences of sub-circuits, to which no partner in the respectively other circuit is allocated, by switching to a lower hierarchy level until at least one occurrence of a sub-circuit is again present for which a partner in the respectively other circuit exists with allocated terminals, and replacing the respective occurrence of the respective lower-ranking sub-circuit by a respective macro component;

further partially expanding occurrences of sub-circuits to which a partner in the respectively other circuit is allocated and wherein all terminals of both occurrences cannot be allocated to one another, or suppressing comparison of the higher-ranking circuit parts; and further partially expanding occurrences of sub-circuits that do not occur an identical number of times in both circuits until a plurality of occurrences of all sub-circuits respectively corresponding to one another coincides, wherein internal hierarchies of a pair of potentially equivalent sub-circuits are reshaped into isomorphic hierarchies.

3. A method for hierarchic logic verification of VLSI circuits, a hierarchic layout circuit acquired from a physical layout of a VLSI circuit using an extraction procedure being compared to a hierarchic logic plan circuit defined by a logic plan, the layout circuit and the logic plan circuit having sub-circuits, comprising the steps of:

in a step 1, canceling terminals of a sub-circuit that are not connected to any component of this sub-circuit within this sub-circuit or are not connected to any occurrence of a lower-ranking sub-circuit that belongs to at least one next-lower hierarchy level;

in a step 2, combining terminals of a sub-circuit that are externally connected to one another in all occurrences of a respective sub-circuit to form a common terminal, whereby this ensues across all hierarchy levels;

in a step 3, canceling terminals of a sub-circuit that do not have an external connection to at least one component of another sub-circuit of the sub-circuits in any occurrence of this sub-circuit as external terminal on the respective hierarchy level;

in a step 4, performing steps 1, 2 and 3 for each hierarchial level of each of the layout circuit and the hierarchic logic plan circuit such that a number of terminals of sub-circuits of each hierarchy level is minimal;

in a step 5, forming pairs of potentially equivalent sub-circuits in that corresponding sub-circuits with a common name are sought in the layout circuit and in the logic plan circuit and are only allocated to one another for sub-circuits having an identical number of terminals;

in a step 6, replacing occurrences of sub-circuits, to which a partner in the respectively other circuit is allocated, by a macro component that cannot be further detailed, insofar as at least all terminals of both occurrences of sub-circuits are completely allocated to one another;

in a step 7, partially expanding occurrences of sub-circuits, to which no partner in the respectively other circuit is allocated, by switching to a lower hierarchy level until at least one occurrence of a sub-circuit is again present for which a partner in the respectively other circuit exists with allocated terminals, and replacing the respective occurrence of the respective lower-ranking sub-circuit by a respective macro component;

in a step 8, further partially expanding occurrences of sub-circuits to which a partner in the respectively other circuit is allocated and wherein all terminals of both occurrences cannot be allocated to one another, or suppressing comparison of the higher-ranking circuit parts;

in a step 9, further partially expanding occurrences of sub-circuits that do not occur an identical number of times in both circuits until a plurality of occurrences of all sub-circuits respectively corresponding to one another coincides, thereby reshaping internal hierarchies of a pair of potentially equivalent sub-circuits into isomorphic hierarchies; and in a step 10, performing steps 6, 7, 8 and 9 with regards to each of lower-ranking sub-circuits occurring in the respective sub-circuits to be compared.

* * * * *